United States Patent [19]
Beilin et al.

[11] Patent Number: 5,746,903
[45] Date of Patent: May 5, 1998

[54] WET CHEMICAL PROCESSING TECHNIQUES FOR PLATING HIGH ASPECT RATIO FEATURES

[75] Inventors: Solomon I. Beilin, San Carlos; William T. Chou, Cupertino; Michael G. Lee, San Jose; Wen-chou Vincent Wang, Cupertino, all of Calif.

[73] Assignee: Fujitsu Limited, Japan

[21] Appl. No.: 687,716

[22] Filed: Jul. 26, 1996

[51] Int. Cl.$^6$ .................................................. C25D 5/02
[52] U.S. Cl. ...................... 205/118; 205/123; 205/125; 427/98; 430/313
[58] Field of Search .............................. 205/118, 123, 205/125; 427/98; 430/313

[56] References Cited

U.S. PATENT DOCUMENTS

| | | | |
|---|---|---|---|
| 3,013,955 | 12/1961 | Roberts | 204/15 |
| 3,615,465 | 10/1971 | Bullinger | 96/36.2 |
| 3,930,963 | 1/1976 | Polichette et al. | 204/15 |
| 4,057,663 | 11/1977 | Preston | 427/307 |
| 4,576,743 | 3/1986 | Kita et al. | 252/524 |
| 4,751,170 | 6/1988 | Mimura et al. | 430/296 |
| 4,931,149 | 6/1990 | Stierman et al. | 205/118 |
| 4,981,770 | 1/1991 | Taylor | 430/313 |
| 5,015,538 | 5/1991 | Krause et al. | 428/626 |
| 5,025,280 | 6/1991 | Lamb et al. | 354/299 |
| 5,077,176 | 12/1991 | Baggio et al. | 430/313 |
| 5,110,709 | 5/1992 | Aoai et al. | 430/271 |
| 5,158,860 | 10/1992 | Gulla et al. | 430/315 |
| 5,166,037 | 11/1992 | Atkinson et al. | 430/315 |

Primary Examiner—Kathryn L. Gorgos
Assistant Examiner—Kishor Mayekar
Attorney, Agent, or Firm—Coudert Brothers

[57] ABSTRACT

Methods of forming high-aspect ratio blind apertures and thereafter filling the apertures with a plating solution are disclosed. A layer of photosensitive material is pattern exposed to actinic radiation to define the apertures, and thereafter exposed to aqueous developer solution. The apertures are then rinsed with water and thereafter exposed to plating solution without drying the aperture of water or developer solution. This is contrary to conventional practice where photoresist layers are dried, and usually post-baked after the development step in order to improve dimensional integrity and reduce swelling of the photoresist material. However, the inventors have recognized that the conventional drying and post-baking steps forever destroy the best opportunity to wet the walls of high-aspect ratio apertures with water, and have discovered that continually maintaining water within the aperture between the development and electroplating steps provides the best opportunity to fill the apertures with plating solution.

10 Claims, 5 Drawing Sheets

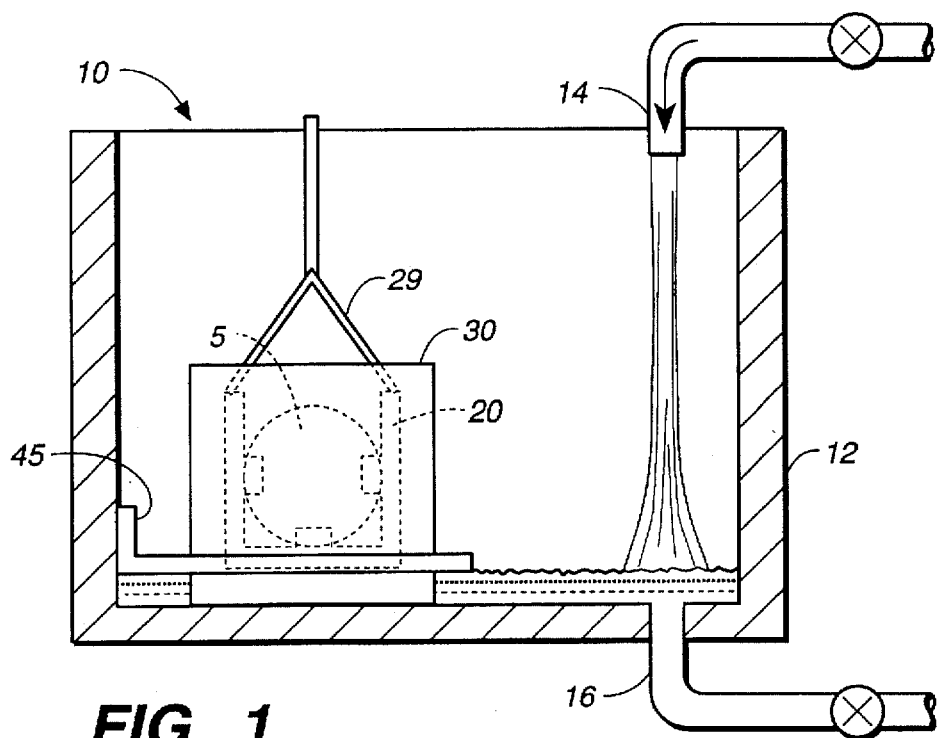
FIG._1
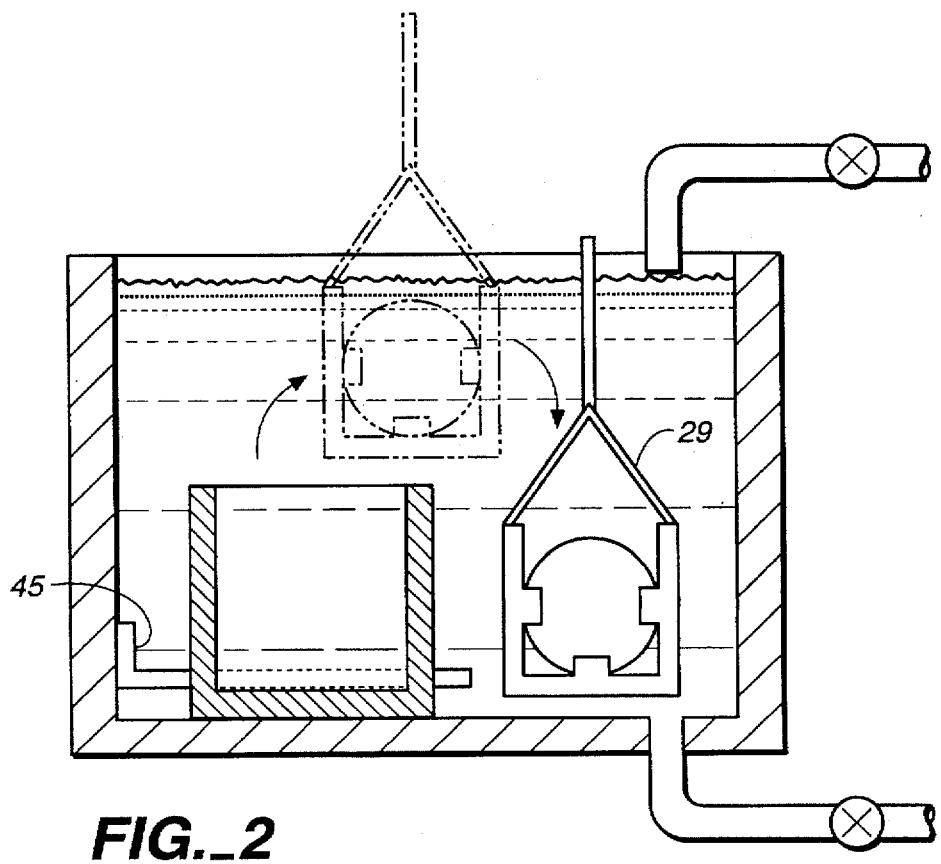
FIG._2

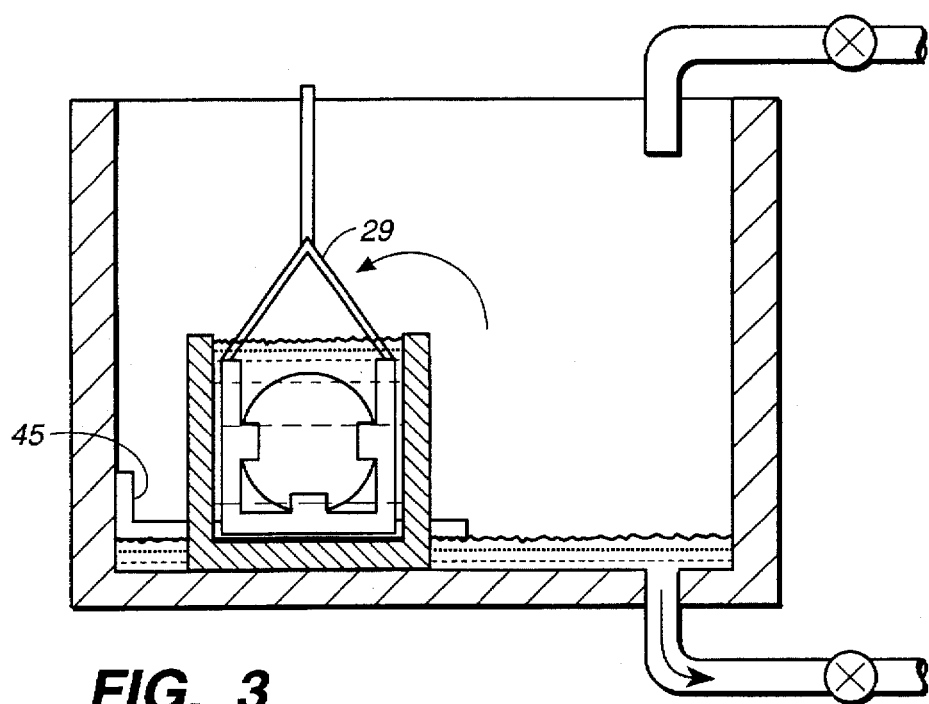
FIG._3
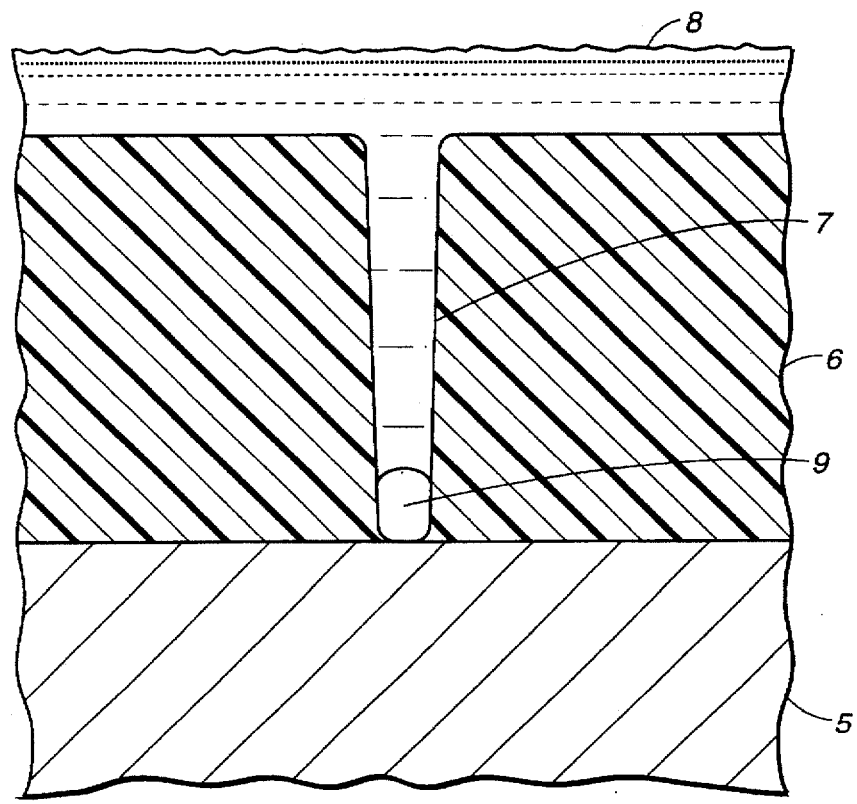
FIG._6 (PRIOR ART)

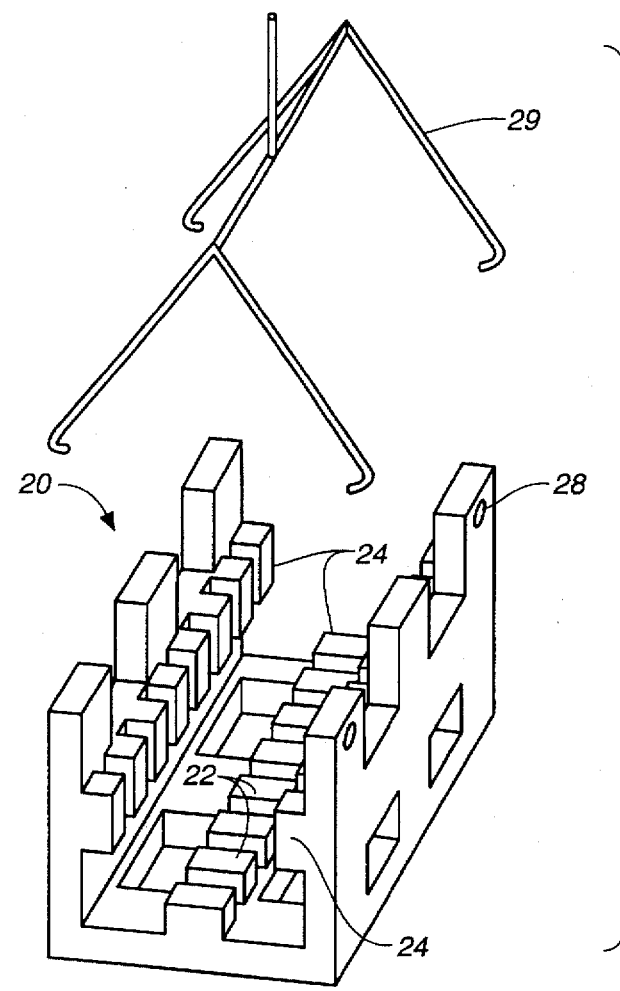
FIG._4
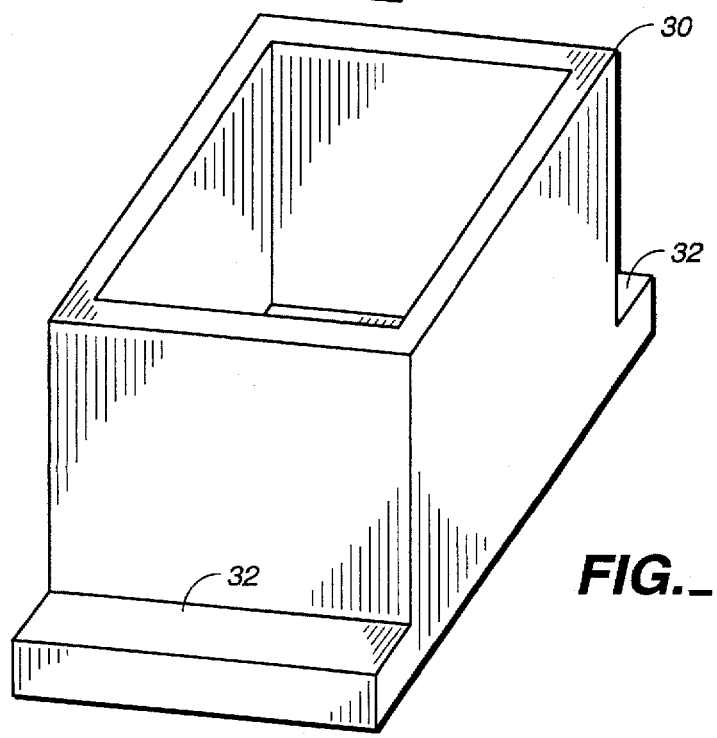
FIG._5

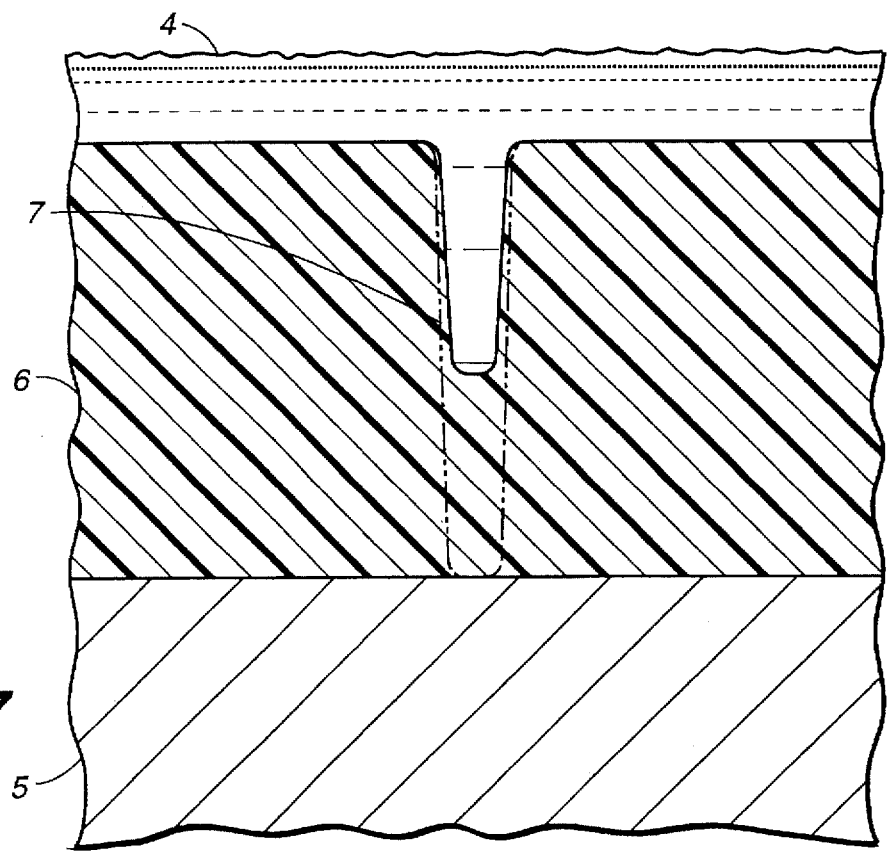
FIG._7
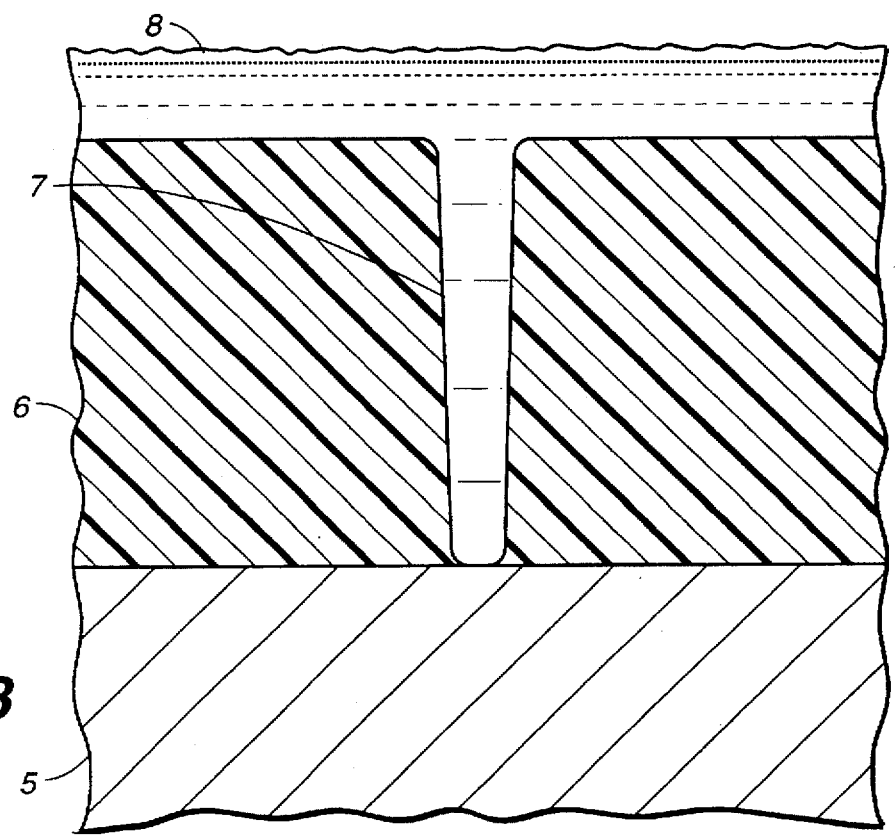
FIG._8

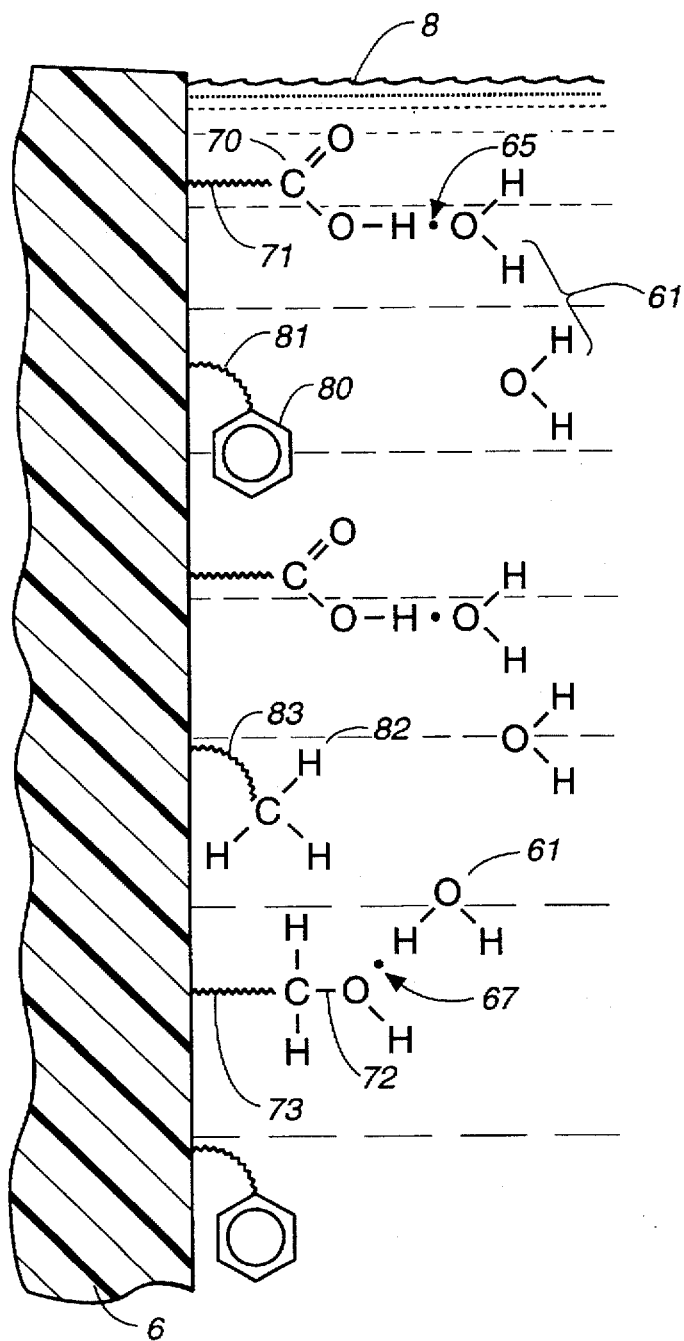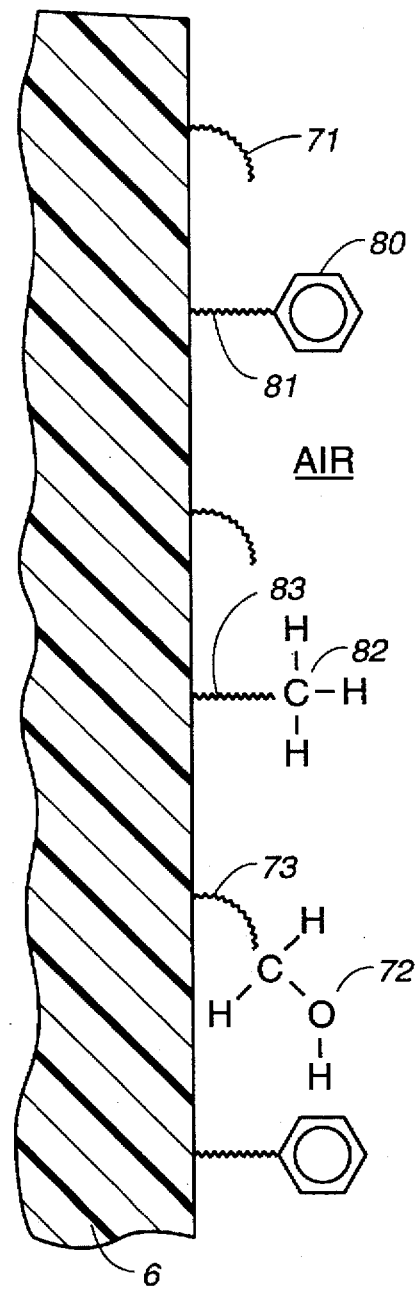
FIG._9   FIG._10

WET CHEMICAL PROCESSING TECHNIQUES FOR PLATING HIGH ASPECT RATIO FEATURES

FIELD OF THE INVENTION

The present invention generally relates to the processing of high-aspect ratio structures in photo-sensitive layers, such as photoresist layers, such that fluid accessibility of wet chemicals associated with the processing of these structures can be maintained despite the typical hydrophobic quality of photo-sensitive materials. More particularly, the present invention relates to the processing of high-aspect ratio structures to improve the plating of conductive material within such structures.

BACKGROUND OF THE INVENTION

The present invention is directed to forming patterns in photo-imageable layers, such as photoresist layers, and thereafter plating conductive material within the patterns to form high-aspect ratio structures. Photoresists, as well as all photo-imageable materials, are generally classified into two groups: positive-type materials and negative-type materials. Positive-type materials become soluble in a developer solution (e.g., alkaline-aqueous solution) when exposed to light radiation, usually ultraviolet. Negative-type materials become insoluble in a developer solution (e.g., an organic solvent) when exposed to light radiation. In either case, the light generally must be within a given range of wavelengths, the range being a function of the chemical and optical properties of the particular photo-imageable material. Light within the wavelength range is often referred to as "actinic" radiation. Some materials are sensitive to electron-beam radiation and/or X-ray radiation. As used herein, actinic radiation for a given material is any electromagnetic radiation having a wavelength capable of activating that material.

In addition to positive- and negative-type photoresists, there are image-reversal (or reversing) photoresists (IRPs), which are positive-type photoresists which can be post-treated to reverse the initially exposed images therein. IRP resists are also called dual tone resists, and are classified as positive resists because their chemical structures are closest to those of positive photoresists.

Photo-sensitive materials have recently been used to form high-aspect ratio interconnect posts, such as those described in U.S. Pat. No. 5,334,804, which is commonly assigned to the assignee of the present invention. Such structures are formed by applying a relatively thick layer of photosensitive material to a base substrate, such as between 40 µm to 80 µm thick, pattern exposing the layer to actinic radiation and thereafter developing it to form high-aspect ratio apertures. These apertures are generally called blind apertures or blind vias because they are only open at one surface of the photosensitive layer. The apertures typically have a cylindrical shape with an average diameter of between 10 µm and 20 µm, and are often tapered along their length, being wider at the top than at the bottom. For example, an aperture may have a top width of 15 µm and a bottom width of 10 µm, for an average width of 12.5 µm. Conductive material is then plated within the blind apertures to form a conductive post, and thereafter the photoresist material is removed (stripped) from the substrate. Electroless plating, electrolytic plating, or a combination thereof may be used to fill the apertures. For taller structures, electrolytic plating, sometimes called electroplating, is preferred because of its higher plating rate. For the electrolytic plating operation, each aperture is formed over a conductive pad or seed layer.

The inventors have found that, as the aspect ratio of these blind vias increases and as their average width decreases, it becomes more difficult for the plating solution to reach the bottom of the apertures due to air pockets within the apertures and the surface tension of the plating solution. If the plating solution does not reach the bottom of the aperture, no post is formed. The inventors have found that at very large aspect ratios, the conventional approaches of filling vias with plating solution, or pre-plating solution, have unacceptably high failure rates. One such method is to expose the via to a water vapor to allow water to absorb or condense on the aperture walls. For reasons that are unclear, the approach has not been wholly effective for very high aspect ratio apertures. Another such method is to first fill the aperture with a water-soluble gas, such as ammonia ($NH_3$), and thereafter place the wafer in water. The ammonia dissolves into the water and draws the water down the aperture. This method fails when a relatively non-soluble gas, such as nitrogen or oxygen, is present at a sufficient partial pressure within the aperture to leave an air pocket. Such partial pressure can be caused by incomplete filling of the aperture with the soluble gas (due to slow gas diffusion rates), or by a substantial amount of the non-soluble gas being absorbed on the aperture walls prior to filling the apertures with the soluble gas.

SUMMARY OF THE INVENTION

The inventors have found that a better method of drawing plating solution down an aperture is to utilize the wetting forces of the previous development step to draw developer solution down to the bottom of a blind aperture as it develops the aperture, and to then replace the developer solution with plating solution without drying the aperture of water. This is in contrast to the conventional prior art practice where a photoresist layer is dried, and usually post-baked, after the development step. The prior art correctly teaches that the drying and post-baking operations improve the dimensional integrity of the patterns by reducing the swelling of the photoresist caused by absorption of water from the developer solution, and by improving adhesion of the resist to the underlying layer. However, the inventors recognize that drying and post-baking forever destroy the best opportunity to wet the walls of apertures with water.

Many conventional photoresists and photo-sensitive materials, particularly conventional DQN-based positive photoresists, comprise monomers and polymers that have hydrophilic molecular groups (e.g., —COOH, —$CH_2OH$) and hydrophobic molecular groups (e.g., phenyl groups, —$CH_3$). The hydrophilic groups are polar in nature and attract water molecules, readily forming weak chemical bonds thereto. The hydrophobic groups are substantially non-polar in nature and do not attract or form bonds with water. It is believed by the inventors that, when the resist material is developed to form a pattern therein, both hydrophilic groups and hydrophobic groups are present at the side walls of the patterns, with their associated monomer and polymer components being imbedded into the resist walls. It is further believed that the water of the developer solution causes the hydrophilic groups to extend outward and into the aqueous solution, thereby countering the water's surface tension forces along the aperture wall. It is further believed that the water forces the hydrophobic groups toward the side walls of the resist pattern, thereby enhancing the action of the hydrophilic groups.

Once fully developed, the aperture is nearly perfectly coated with an aqueous solution, which is ideal for conveying a plating solution to the bottom of a blind aperture. However, in conventional prior art processing, this near perfect coating is lost by the subsequent rinsing, drying and baking steps, which expel the developer solution from the aperture to stop the developer from over-etching the aperture. Some of the hydrophilic groups formed along the side walls of the apertures are separated from their monomer and polymer units by the removed water. Moreover, the remaining hydrophilic groups tend to bend toward the side walls as their polar ends seek a complementary charged atom, whereas the hydrophobic groups tend to stick out since both they and the air are substantially non-polar. Upon trying to re-wet the side walls of the aperture, the hydrophobic groups repel the water and many of the hydrophilic groups have their polar ends attached to the side walls, and are thereby unable to wet to the water. Accordingly, once an aperture side wall is dried, it forever loses a substantial amount of its initial capacity to attract water.

Broadly stated, the present invention comprises methods of forming and thereafter filling a high-aspect ratio blind aperture with a plating solution comprising the steps of pattern exposing a layer of photosensitive material to define the aperture and exposing the layer to an aqueous developer solution. The aperture is then rinsed without drying the aperture of the developer solution or of the water. The aperture and layer are thereafter exposed to a plating solution such that the aperture is not dried of water between the time the aperture is rinsed and the time the aperture is exposed to the plating solution. The methods of the present invention allow for, but do not require, the aperture to be exposed to various pre-plating liquids (for example, activators, pre-plating solutions, catalysts, mild metal etchants, etc.) after rinsing and before exposure to the plating solution.

With the steps according to the present invention, there is at least a film of water maintained along the walls of the aperture which maintains the hydrophilic capacity of the hydrophilic molecule groups. The present invention is contrary to conventional practice and thinking, which prescribes spin drying the developed photoresist followed by post-baking at a temperature between 70° C. and 110° C. Such post-baking is generally needed to improve the dimensional stability of the patterned photoresist.

BRIEF DESCRIPTION OF THE DRAWINGS

FIG. 1 shows a cross-sectional view of an apparatus according to the present invention for practicing the methods according to the present invention.

FIG. 2 shows a cross-sectional view of the apparatus shown in FIG. 1 where the main tank thereof has been filled with a liquid solution and the substrate carrier has been lifted out of the holding bin according to the present invention.

FIG. 3 shows a cross-sectional view of the apparatus shown in FIG. 2 where the substrate carrier has been moved back into the holding bin and where the main tank is being drained of the liquid solution.

FIG. 4 shows an isometric view of an exemplary wafer/ substrate carrier for use in the apparatus and methods according to the present invention.

FIG. 5 shows an isometric view of an exemplary holding bin according to the present invention.

FIG. 6 shows a cross-sectional view of a high-aspect ratio aperture processed according to the prior art where the photoresist material is dried and baked before exposure to electroplating solution.

FIG. 7 shows a cross-sectional view of a high-aspect ratio aperture in the process of being developed according to the methods of the present invention.

FIG. 8 shows the completely developed aperture of FIG. 7 subsequently filled with plating solution according to methods of the present invention.

FIG. 9 shows an expanded view of a side wall of the aperture shown in FIG. 8 where exemplary hydrophobic and hydrophilic molecular groups associated with monomers and polymers of the resist material are schematically shown.

FIG. 10 shows the state of the molecular groups shown in FIG. 9 when the resist surface is dried.

DETAILED DESCRIPTION OF THE INVENTION

In preferred embodiments of the present invention, the exposed photosensitive layer is sequentially developed, rinsed, and exposed to a plating solution without substantially breaking the liquid phase. An apparatus for performing these steps is shown at 10 in FIG. 1. Apparatus 10 comprises a main tank 12, which has sufficient capacity to hold a substrate carrier 20 and a holding bin 30. In FIG. 1, carrier 20 is shown positioned within holding bin 30, and is therefore shown in phantom by dashed lines. Carrier 20, which is often called a "boat" in the industry, holds a plurality of substrates 5 in a vertical position, and spaced apart from one another by a minimum distance. The substrates 5 held by carrier 20 may be circular or rectangular. Each substrate 5 is held in a vertical position by one or more slots formed along the inner sides of carrier 20, similar to the manner in which a dish rack holds dishes in an upright position. FIG. 4 shows an isometric view of carrier 20, where slots 22 are formed along three bars 24, which are positioned at three sides of carrier 20. Carrier 20 may be maneuvered by means of a holder 29 formed by rigid plastic material which has four pronged ends which plug into four corresponding holes 28 in carrier 20.

Holding bin 30 has sufficient width, length, and height to fully accommodate the body of carrier 20. Holding bin 30 is substantially leak-proof, and can maintain carrier 20 and the substrates therein fully covered with an aqueous solution. An isometric view of holding bin 30 is shown in FIG. 5. Holding bin 30 is affixed against the bottom of main tank 12, or is constructed with high density material which does not permit it to float when main tank 12 is filled with water. The particular affixing means employed is not critical to making or using the present invention. As one example, holding bin 30 may comprise tab-shaped flanges 32 formed at the bottom edges of the ends of holding bin 30, and main tank 12 may comprise two holding brackets 45 attached to one side of main tank 12 and positioned above the bottom of main tank 12 by a distance slightly greater than the thickness of tabular flanges 40. Holding brackets 45 are spaced apart from one another by slightly more than the length of the main portion of holding bin 30. To affix holding bin 30, it is lowered to the bottom of main tank 12 at the right-most side of tank 12 and then slid to the left-most side of tank 12 such that tabular flanges 32 slide underneath brackets 45, to be held in place thereby.

Referring to FIG. 1, substrates 5 with photosensitive layers that have been exposed to actinic radiation are placed in carrier 20, which in turn is placed within holding bin 30. Main tank 12 is filled with a developer solution through a feed line 14 positioned above tank 12. Tank 12 is filled to the level that carrier 20 may be lifted out of holding bin 30 and moved over to an adjacent open space near the right-most side of tank 12 where carrier 20 may be gently agitated to facilitate the development operation, as shown in FIG. 2. Referring to FIG. 4, apertures are formed in the sides of carrier 20 to facilitate the ingress and egress of the aqueous developer solution caused by the gentle agitation. Near the end of the appropriate development time, carrier 20 is moved back within holding bin 30, and the developer solution is drained from main tank 12 through a drain 16 formed at the bottom of tank 12, as shown in FIG. 3. The bottom of tank 12 may be slanted toward drain 16 to facilitate the drainage. Developer solution remains within holding bin 30, thereby maintaining a liquid environment around substrates 5. The developer solution may be collected from drain 16 and re-used. In both of FIGS. 2 and 3, the front face and front flange 32 of holding bin 30 have been removed to more clearly show the back flange 32 and the fitting of carrier 20 within holding bin 30.

Next, a feed line providing rinse water is moved into position over main tank 12 and turned on to fill main tank 12 with rinse water in the same manner that tank 12 was filled with developer solution. Once the water level reaches the top of holding bin 30, rinse water diffuses into holding bin 30 to lower the chemical concentration of the developer solution, thereby slowing or terminating the development process. As before, tank 12 is filled to the level that carrier 20 may be lifted out of holding bin 30 and over to an adjacent open space near the right-most side of tank 12, as shown in FIG. 2, where carrier 20 may be gently agitated to facilitate the rinsing operation. Carrier 20 is moved back within holding bin 30, and the rinse is drained from main tank 12 through drain 16, to be discarded. The rinse operation may be repeated one or more times if desired. Developer solution for many positive-type photoresists are basic (i.e., pH levels between 8 and 13), which are incompatible with acid-based electroplating solutions (which have pH levels between 1 and 5). When going from a basic developer solution to an acidic plating solution, it is desirable to use at least two rinse operations.

Once rinsing is completed, main tank 12 may be filled with electroplating solution to a point where carrier 20 may be lifted from holding bin 30 and moved over to the right side of main tank 12 for gentle agitation. Carrier 20 is then moved back to holding bin 30, and main tank 12 is drained of plating solution, which may be reused. Holding bin 30 may then be removed from main tank 12 and transported to a plating tank for plating.

Between the rinse operation and before the exposure operation to the plating solution, the wafers may be exposed to various preconditioning solutions. For example, many electroless operations require exposing the plating surface to etchants, activators, catalysts, etc., and many electrolytic electroplating operations expose the plating surface to an etchant or electropolishing solution. For example, holding bin 30 may be filled with an electropolishing solution by the above-described steps, then transported to an electropolishing tank for the polishing operation (if required for the particular electropolishing solution), and then transported back to main tank 12 to be filled with electroplating solution.

With the above-described steps, high-aspect ratio features are developed in the layer of photosensitive material, and thereafter rinsed and filled with electroplating solution such that the developed features are not dried of water between the time they are rinsed and the time they are exposed to the plating solution.

In the above-described method, the layer is surrounded by liquid during and between each of the development, rinse, and plating-solution steps. Accordingly, the surfactants that are normally added to electroplating solutions are not strictly needed, although their addition is not detrimental and may provide some protection against the spurious nucleation of gas bubbles along the walls of the aperture.

As a second general embodiment of the present invention, conventional spin development and spin rinsing steps may be modified and used in place of the bath development and bath rinsing steps described above. The spin development and rinsing steps are modified in that only low spin speeds are employed, and in that the high-speed finishing spin cycles, which usually exceed 1,500 revolutions-per-minute (rpm) for a few minutes, are eliminated. Preferably, the spin speed should be kept under 600 rpm when liquid developer or rinse water is being dispensed or sprayed over the substrate, and under 60 rpm when liquid is not being dispensed or sprayed. More preferably, the speed is kept under 30 rpm, and between 10 rpm and 20 rpm, when liquid is not being dispensed or sprayed. A typical spin development would comprise low speed spins at between 10 rpm to 30 rpm with three to five periodic sprays of developer solution, and a subsequent spray rinse would comprise a continuous spray or dispense at 500 rpm for 1 to 2 minutes, with the speed reduced to zero (or to under 40 rpm) while the rinse water is being sprayed or dispensed. Despite the low-speed spinning, a substantial portion of water remains at the bottom of the apertures, with the water's meniscus keeping the upper portions of each aperture wet. Once spray-developed and spray-rinsed in this manner, the substrate is lifted off of the spin platen, and transported to a tank of the next solution bath (e.g., pre-soak, catalyst, electropolish, etc.), preferably in a substantially horizontal position. The wafer is preferably inserted into the bath at a small angle (less than 20°) with respect to the horizontal plane.

FIG. 6 shows an aperture 7 in a layer 6 of a photoresist material which has been processed by conventional prior art methods where the layer 6 and aperture 7 are dried prior to exposure to a plating solution 8. Aperture 7 has a diameter (e.g. width) less than 20 µm and an aspect ratio of 6 or more. Typically, aperture 7 has a top diameter of 12 µm to 15 µm, a bottom diameter of between 8 µm to 10 µm, and a height of approximately 80 µm. An air pocket 9 is present at the bottom of via 7, and cannot be wetted by solution 8 due to the surface tension of solution 8 and the hydrophobic characteristic of the dried photoresist 6. FIG. 7 shows an aperture 7 being developed by a developer solution 4 according the present invention. FIG. 8 shows aperture 7 subsequently filled with plating solution according to the methods of the present invention. No air pocket 9 is present in the aperture shown in FIG. 8.

Aperture 7 is particularly well-suited to the manufacture of advanced versions of the Wire Interconnect Structures disclosed in U.S. Pat. No. 5,334,804, which is commonly assigned to the assignee of the present invention. Such wire interconnect structures preferably have widths less than 20 µm, and height-to-width aspect ratios of between 4 and 8. The methods according to the present invention enable advanced versions of the structure to have even greater aspect ratios.

FIG. 9 schematically shows some exemplary hydrophilic and hydrophobic molecular groups that are present at the developed surface of aperture 7 while water 8 is still present in the aperture. Shown at 70 is a hydrophilic carboxyl acid group (—COOH) 70 which is attached to a monomer 71 (partially and schematically shown by zig-zag lines), which is partially embedded in the resist 6. A water molecule 61 is weakly bonded to carboxyl group 70, between the oxygen atom of the water and the hydrogen atom of the carboxyl group, as shown at 65. A hydrophilic methyl alcohol group (—CH₂—OH) is shown at 72, which is attached to a polymer 73. A water molecule 61 is weakly bonded to the alcohol —OH group of methyl group 72, between the hydrogen atom of the water and the oxygen atom of the alcohol group, as shown at 67. Both of these hydrophilic groups are drawn outward into the water by the water molecules 61.

A hydrophobic phenyl group is shown at 80 and a hydrophobic methyl group is shown at 82 in FIG. 9. Each of these groups is attached to a corresponding monomer/polymer 81 and 83, respectively. These groups are not attracted to the water, and tend to be pushed toward the side wall of the resist 6.

FIG. 10 shows these groups after drying. Hydrophilic carboxyl acid group 70 has been removed by the drying process, while hydrophilic methyl alcohol group 72 bends toward the side wall, where its polar —OH group gravitates to an atom of complementary charge. The hydrophobic phenyl and methyl groups 80 and 82 remain intact and are extended outward in the air. Once dried, the hydrophobic groups 80 and 82 dominate the wetting characteristic of the resist's side walls, with many of the hydrophilic carboxyl acid groups destroyed and the remaining hydrophilic groups finding alternate bonding arrangements for their polar ends. These effects make it difficult to re-wet the surface of the resist after it has been dried, particularly for apertures with aspect ratios above 8.

While the present invention has been particularly described with respect to the illustrated embodiments, it will be appreciated that various alterations, modifications and adaptations may be made based on the present disclosure, and are intended to be within the scope of the present invention. While great care has been taken in the methods to ensure that substantially all of the aperture's side walls remain coated with water between the development and electroplating steps, it is believed by the inventors that only the lower portions of the side walls need be coated with water in most cases since the upper portions are the easiest to re-coat with water. Accordingly, in such cases, less stringent handling of the substrates may be tolerated. In some cases, it may be possible to use separate developer, rinse, and plating baths, and to lift carrier 20 from one bath to the next, briefly exposing the substrates to air. It may also be appreciated that, although the photosensitive material has been shown as constructed directly onto the substrate, there may be intervening layer structures between the photosensitive layer and the substrate. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of filling a high aspect-ratio aperture with a plating solution, said aperture being formed within a photosensitive layer, said method comprising the steps of:

(a) pattern exposing a layer of photosensitive material to actinic radiation to define said aperture;

(b) exposing said pattern-exposed photosensitive layer to a developer solution which comprises water to develop said aperture therein, said aperture being surrounded by one or more walls of said pattern-exposed photosensitive layer, each said wall having hydrophilic molecular groups disposed thereon and being coated with at least a film of water from the developer solution, said film of water maintaining said hydrophilic molecular groups on each said aperture wall;

(c) thereafter rinsing said developed photosensitive layer with water without drying said aperture of the film of water from the developer solution of said exposing step, said rinsing step maintaining said film of water and said hydrophilic molecular groups; and (d) exposing said rinsed photosensitive layer to a plating solution, wherein said aperture is not dried of the film of water between the time it is rinsed in step (c) and the time it is exposed to the plating solution in step (d), said film of water and said hydrophilic groups being maintained between the time said aperture is rinsed in step (c) and the time said aperture is exposed to the plating solution in step (d).

2. The method of claim 1 wherein each of the layers in steps (b), (c), and (d) is surrounded by aqueous solution during and between each of steps (b), (c), and (d).

3. The method of claim 1 wherein said step (c) of rinsing comprises the step of sequentially exposing said developed photosensitive layer to two or more sequential baths of water.

4. The method of claim 1 further comprising the step of exposing said rinsed photosensitive layer to a pre-plating solution after step (c) and prior to step (d).

5. The method of claim 1 wherein said photosensitive material comprises a photo-active compound which forms a hydrophilic acid group upon exposure to actinic radiation and subsequent exposure to said developer solution.

6. The method of claim 1 wherein said aperture has a width dimension W, a height dimension H, and an aspect ratio of H/W which is greater than 4.

7. The method of claim 6 wherein the width dimension W is less than 20 μm.

8. The method of claim 6 further comprising the step of plating conductive material into said aperture.

9. The method of claim 1 wherein step (b) comprises a spin development step of dispensing or spraying said developer solution on said pattern-exposed layer while said pattern-exposed layer is being rotated at a spin speed, said spin speed being kept below 600 revolutions per minute when said developer solution is being dispensed or sprayed.

10. The method of claim 1 wherein step (c) comprises a spin rinse development step of dispensing or spraying water on said developed layer while said developed layer is being rotated at a spin speed, said spin speed being kept below 600 revolutions per minute.

* * * * *